US007620613B1

(12) United States Patent
Moore et al.

(10) Patent No.: US 7,620,613 B1
(45) Date of Patent: Nov. 17, 2009

(54) THERMAL MANAGEMENT OF DATA CENTERS

(75) Inventors: Justin Moore, Durham, NC (US); Parthasarathy Ranganathan, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 502 days.

(21) Appl. No.: 11/494,942

(22) Filed: Jul. 28, 2006

(51) Int. Cl.
*G06F 15/00* (2006.01)

(52) U.S. Cl. .......................... 706/62; 706/14; 706/15; 706/45; 700/28; 700/29; 700/32; 702/85; 702/99

(58) Field of Classification Search .................. 706/12, 706/14, 15, 23, 45; 700/276, 28–33, 47–50; 702/85, 99
See application file for complete search history.

(56) References Cited

U.S. PATENT DOCUMENTS

| 6,732,540 | B2 * | 5/2004 | Sugihara et al. ............... 62/177 |
| 7,447,920 | B2 * | 11/2008 | Sharma et al. .............. 713/300 |
| 2005/0023363 | A1 * | 2/2005 | Sharma et al. ............. 236/49.3 |
| 2005/0278070 | A1 * | 12/2005 | Bash et al. .................. 700/276 |

OTHER PUBLICATIONS

Moore et al. "Making Scheduling "Cool": Temperature-Aware Workload Placement in Data Centers", 2005 USENIX Annual Technical Conference, pp. 61-74.*
Boucher et al. "Viability of Dynamic Cooling Control in a Data Center Environment", IEEE, 2004 Inter Society Conference on Thermal Phenomena, pp. 593-600.*
Patel et al. "Thermal Considerations in Cooling Large Scale High Compute Density Data Centers", IEEE, 2002 Inter Society Conference on Thermal Phenomena, pp. 767-776.*
Sharma et al. "Experimental Investigation of Design an Performance of Data Centers", IEEE, 2004 Inter Society Conference on Thermal Phenomena, pp. 579-585.*
Sharma et al. "Dimensionless Parameters for Evaluation of Thermal Design and Performance of Large-Scale Data Centers", 2002, American Institute of Aeronautics and Astronautics, pp. 1-11.*
Fast Artificial Neural Network Library (FANN), downloaded Jun. 15, 2006.
Dallas Semiconductor, downloaded Jun. 16, 2006.
LM Sensors Development Team, Hardware Monitoring for Linux, downloaded Jun. 16, 2006.
OPC Foundation, downloaded Jun. 16, 2006.
SYSSTAT Utilities Home Page, downloaded Jun. 16, 2006.
Anderson, D. et al., More Than an Interface-SCSI vs. ATA, Proc. of the 2nd Annual Conf. on File and Storage Technology (FAST), Mar. 2003.

(Continued)

*Primary Examiner*—David R Vincent
*Assistant Examiner*—Omar F Fernandez Rivas

(57) ABSTRACT

In a method for thermally managing a data center housing at least one electronic component, the heat generated by a heat generating device of the at least one electronic component is estimated. In addition, a temperature detected by a first temperature sensor positioned to detect an interior temperature of the at least one electronic component is received. The estimated heat generated by the at least one heat generating device is substantially masked out from the temperature detected by the first temperature sensor and an inlet temperature of the at least one electronic component is determined from a difference between the substantially masked out temperature and the temperature detected by the first temperature sensor.

20 Claims, 7 Drawing Sheets

OTHER PUBLICATIONS

Arlitt, M. et al., "Workload Characterization of the 1997 World Cup Web Site", HPL-1999-35, Hewlett Packard Company, Sep. 1999.
Barroso, L. A. et al., "Web Search for a Planet: The Google Cluster Architecture", IEEE Computer Society, 2003.
Bradley, D. J. et al., "Workload-based Power Management for Parallel Computer Systems", IBM vol. 47 No. 5/6 Sep./Nov. 2003.
Case, J. et al., A Simple Network Management Protocol (SNMP), May 1990.
Chase, J. S. et al., "Managing Energy and Server Resources in Hosting Centers", downloaded Jun. 16, 2006.
Flautner, K. et al., "Vertigo: Automatic Performance-Setting for Linux", downloaded Jun. 16, 2006.
Huebsch, R. et al., "Querying the Internet with PIER", Proc. of the 29th VLDB Conference, Berlin, Germany, 2003.
Intanagonwiwat, C. et al., "Directed Diffusion: A Scalable and Robust Communication Paradigm for Sensor Networks", MOBICOM 2000, ACM 2000.
Jung, J. et al., "Flash Crowds and Denial of Service Attacks: Characterization and Implication for CDNs and Web Sites", WWW2002, May 7-11, 2002, Hawaii, ACM.
Lippmann, R. P., "An Introduction to Computing with Neural Nets", IEEE ASSP Magazine, Apr. 1987.
Moore, J. et al., "Making Scheduling "Cool": Temperature-Aware Workload Placement in Data Centers", 2005 USENIX Annual Technical Conference.
Pinheiro, E. et al., "Load Balancing and Unbalancing for Power and Performance in Cluster-Based Systems", Technical Report DCS-TR-440, May 2001.
Rajamani, K. et al., "On Evaluating Request-Distribution Schemes for Saving Energy in Server Clusters", downloade Jun. 16, 2006.
Sacerdoti, F. D. et al., "Wide Area Cluster Monitoring with Ganglia", dowloaded Jun. 16, 2006.
Schmidt. R. R. et al., "Challenges of Data Center Thermal Management", IBM vol. 49 No. 4/5 Jul./Sep. 2005.
Van Renesse, R. et al., "Scalable Management and Data Mining Using Astrolabe", downloaded Jun. 16, 2006.
Sharma, R. K. et al., "Balance of Power: Dynamic Thermal Management for Internet Data Centers", HPL-2003-5, Hewlett Packard Co., Feb. 18, 2003.
Sullivan, R. F., "Alternating Cold and Hot Aisles Provides More Reliable Cooling for Server Farms", The Uptime Institute, 2002-2006.
Zeng, H. et al., "ECOSystem: Managing Energy as a First Class Operating System Resource", Technical Report CS-2001-01, Mar. 2001, revised Aug. 2001.

* cited by examiner

THERMAL MANAGEMENT OF DATA CENTERS

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

It is often beneficial to track the temperatures of cooling airflow supplied into the computer systems to generally ensure that the computer systems remain below specified temperatures. Conventionally, the airflow temperatures have been detected through use of relatively large numbers of temperature sensors positioned throughout the data center. One problem associated with this approach is that the costs in obtaining and installing the temperature sensors are typically prohibitively high. Another approach to tracking the airflow temperatures is to calculate the airflow temperatures through use of computational fluid dynamics (CFD) programs. This approach, however, often requires the CFD programs to run for many hours due to the complexities involved in calculating the airflow temperatures.

The problems associated with conventional airflow temperature tracking approaches are further exacerbated with the recent trends toward consolidation and increased computer system densities in the data centers. That is, recent trends in data center design require either greater numbers of temperature sensors or greater computational abilities to track the airflow temperatures in data centers.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are methods and systems for utilizing existing sensors in electronic components housed in a data center to determine thermal conditions at various locations throughout the data center. The existing sensors comprise those that are typically supplied with the electronic components to track the temperatures of heat generating devices housed therein. As disclosed in greater detail herein below, the heat loads generated by the heat generating devices are estimated from the workload on the heat generating devices and are masked out from the temperature measurements obtained by the existing sensors. By substantially masking out the heat generated by the heat generating devices, the resulting temperature is equivalent to the temperature outside of the electronic components. In addition, the ambient temperatures may be used to develop a thermal map of the data center, without suffering from all of the drawbacks and difficulties associated with conventional thermal mapping techniques.

Also disclosed herein are methods and systems for modeling the relationships between the workload on the heat generating devices, the temperature measurements obtained by the existing sensors, and the temperatures at the inlets of the electronic components. The models may be developed and employed, for instance, to predict the inlet temperatures for given workloads and interior temperatures. In one example, machine learning applications may be employed to develop the models.

Figure 1:
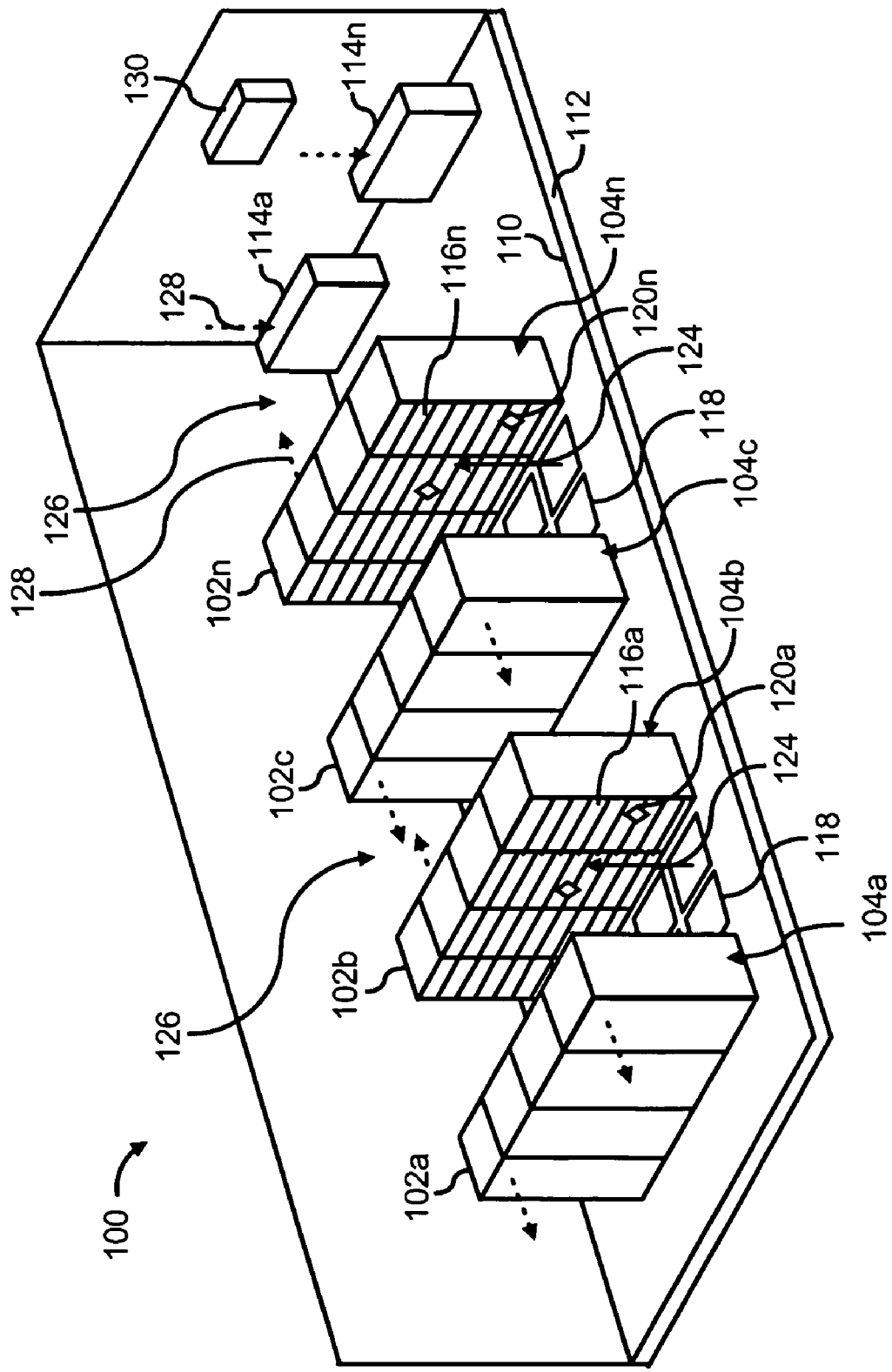
FIG. 1 shows a perspective view of a section of a data center which may employ various examples of a system for thermal management disclosed herein, according to an embodiment of the invention.

With reference first to FIG. 1, there is shown a simplified perspective view of a section of a data center 100 which may employ various examples of a system for thermal management of the data center 100 disclosed herein. The terms "data center" are generally meant to denote a room or other space where one or more components capable of generating heat may be situated. In this respect, the terms "data center" are not meant to limit embodiments of the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer. The racks 102a-102n may comprise, for instance, electronics cabinets configured to house electronic components 116a-116n, for instance, computers, servers, bladed servers, disk drives, displays, etc. The subsystems and the components may be operated to perform various electronic functions, for instance, computing, switching, routing, displaying, and the like.

The racks 102a-102n are depicted as being positioned on a raised floor 110, which may function as a plenum for delivery of cooled air from one or more air moving devices 114a-114n. The air moving devices 114a-114n, where "n" is an integer, generally operate to supply airflow into a space 112 beneath a raised floor 110, and in certain instances to cool heated air (indicated by the arrows 128). In addition, the air moving devices 114a-114n may supply the electronic components 116a-116n housed in the racks 102a-102n with airflow that has been cooled, through any reasonably suitable known manners and may thus comprise widely available, conventional air conditioning (AC) units. For instance, the air moving devices 114a-114n may comprise vapor-compression type air conditioning units, chiller type air conditioning units, etc. Examples of suitable air moving devices 114a-114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

The air moving devices 114a-114n include respective actuators (not shown) configured to manipulate characteristics of the cooled airflow supplied to the racks 102a-102n, such as airflow temperature and supply rate. As such, the actuators include, for instance, devices for manipulating airflow temperature, such as chillers, heat exchangers, etc., and devices for manipulating the supply flow rates, such as variable frequency devices, blowers, etc., of the cooled air.

The cooled air, indicated by the arrows 124, may be delivered from the space 112 to the racks 102a-102n through air delivery devices 118 located between some or all of the racks 102a-102n. The air delivery devices 118 may comprise, for instance, ventilation tiles, variable airflow volume devices, etc., and are shown as being located between rows 104a and 104b and 104c and 104d. Although the air delivery devices 118 and the space 112 have been depicted as being located on a floor of the data center 100, it should be understood that the air delivery devices 118 and the space 112 may be positioned on the ceiling or a wall of the data center 100 without departing from a scope of the invention.

In any regard, the cooled air contained in the space 112 may include cooled air supplied by one or more air moving devices 114a-114n. Thus, characteristics of the cooled air, such as, temperature, pressure, humidity, flow rate, etc., may substantially be affected by the operations of a plurality of the air moving devices 114a-114n. In this regard, characteristics of the cooled air at various areas in the space 112 and the cooled air supplied to the racks 102a-102n may vary, for instance, due to mixing of the cooled air. In other words, the characteristics of the cooled air supplied to a particular location in the data center 100 may differ from that of the cooled air supplied by a single air moving device 114a. In addition, the characteristics of the cooled air supplied through the air delivery devices 118 are affected by the characteristics of air flowing through the other air delivery devices 118.

The characteristics of the airflow, both heated and cooled, in the data center 100 are also affected by the configuration of the racks 102a-102n as well as other components housed in the data center 100. The airflow characteristics are also affected by the amount of heat generated by the electronic components 116a-116n. For instance, the airflow characteristics change as the airflow flows through the racks 102a-102n, as indicated by the arrows 126, and into the air moving devices 114a-114n. More particularly, the types of electronic components 116a-116n housed in the racks 102a-102n as well as the densities with which the electronic components 116a-116n are positioned in the racks 102a-102n, affect the airflow characteristics in the data center 100. The airflow characteristics include, for instance, temperature, airflow direction, airflow velocity, etc.

Generally speaking, the airflow characteristics in a data center may be determined or tracked through use of sensors positioned throughout the data center. In some conventional data centers, a relatively large number of external sensors, such as, multiple external sensors positioned on each rack, are employed to obtain a relatively high level of granularity in tracking the airflow characteristics. One problem, however, is that the use of the relatively large number of external sensors requires a large amount of capital to purchase and install the external sensors, as well as to configure the external sensors to be capable of transmitting detected condition information to database.

According to an example of the invention, the airflow characteristics in the data center 100 may be determined through use of sensors 212 (FIG. 2) placed within the electronic components 116a-116n. More particularly, the sensors 212 generally comprise sensors that are positioned within the electronic components 116a-116n and are typically employed to detect the temperatures of one or more heat generating devices 210 (FIG. 2), such as, processors, microcontrollers, high-speed video cards, memories, semi-conductor devices, and the like, provided with the electronic components 116a-116n. As such, for instance, the sensors 212 may be inserted into the electronic components 116a-116n during the manufacture of the electronic components 116a-116n or during the installation of one or more heat generating devices 210 into the electronic components 116a-116n. The sensors 212 may also be installed during a separate time frame, without departing from a scope of the invention.

As described in greater detail herein below, the heat generated by the heat generating devices 210 may substantially be masked out from the temperature measurements detected by the sensors 212. The resulting temperatures may be inferred as the temperatures of the airflows at the inlets of the electronic components 116a-116n. In one regard, therefore, the number of external sensors 120a-120n, which are represented as diamonds to distinguish them from other elements depicted in FIG. 1, used to detect the temperatures at various locations in the data center 100, may substantially be reduced as compared with conventional systems.

The external sensors 120a-120n are depicted in FIG. 1 as being positioned to detect at least one environmental condition at the inlets of some of the electronic components 116a-116n. The external sensors 120a-120n may, however, be positioned at various other locations, such as, within the racks 102a-102n. In addition, the external sensors 120a-120n may, for instance, comprise sensors configured to detect at least one environmental condition, such as, airflow temperature, mass flow rates of airflow, velocities of airflow, absolute humidity, pressure, etc.

In one example, the airflow characteristics inferred through use of the sensors 212 and the heat load on the electronic components 116a-116n may be employed to create thermal maps of the data center 100. In this example, problem areas, such as, hot spot formations, may be detected through analysis of the thermal maps. In addition, areas of inefficient air moving device 114a-114n operations may be found through detection of overly cold spots in the data center 100.

In addition or alternatively, the thermal maps may be employed to develop control policies for the air moving devices 114a-114n, and in some instances, the air delivery devices 118, for instance, to achieve pre-specified thermal management objectives, to substantially minimize the energy required to adequately cool the electronic components 116a-116n, etc. In any regard, the control policies may be developed by a policy agent 130. In one example, the policy agent 130 may control various operations in the data center 100, such as, data collection and processing, cooling system component (air moving devices 114a-114n, air delivery devices 118, etc.) control, workload placement among electronic components 116a-116n, etc. Some of the functions of the policy agent 130 are described in greater detail herein below.

Although the policy agent 130 is illustrated in FIG. 1 as comprising an element separate from the electronic components 116a-116n housed in the racks 102a-102n, the policy agent 130 may comprise one or more of the electronic components 116a-116n without departing from a scope of the data center 100 disclosed herein. In addition, or alternatively, the policy agent 130 may comprise software configured to operate on a computing device, for instance, one of the electronic components 116a-116n or a separate computing device. In any regard, various operations performed by the policy agent 130 are described in greater detail with respect to the following figures.

Figure 2:
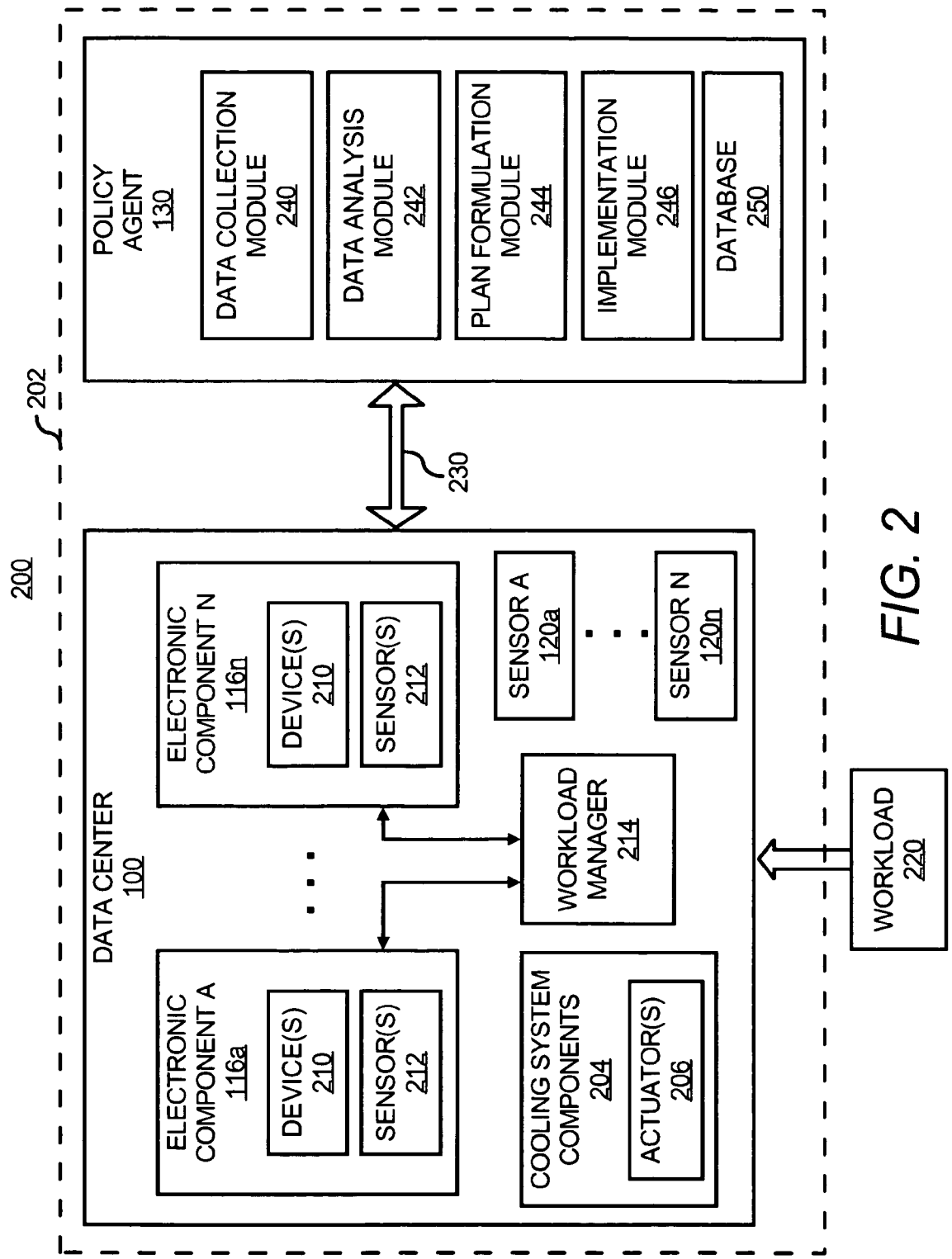
FIG. 2 shows a block diagram of a system for thermal management of a data center, according to an embodiment of the invention.

With reference first to FIG. 2, there is shown a block diagram 200 of a system 202 for thermal management of a data center 100, according to an example. It should be understood that the following description of the block diagram 200 is but one manner of a variety of different manners in which such a thermal management system 202 may be configured. In addition, it should be understood that the thermal management system 202 may include additional components and that some of the components described herein may be removed and/or modified without departing from a scope of the thermal management system 202. For instance, the thermal management system 202 may include any number of sensors, memories, processors, air moving devices, vent tiles, etc., as well as other components, which may be implemented in the operations of the thermal management system 202.

As shown, the thermal management system 202 includes the policy agent 130 depicted in FIG. 1, which may comprise any of the computing devices described above. The policy agent 130 may moreover comprise a microprocessor, a micro-controller, an application specific integrated circuit (ASIC), and the like, configured to perform various processing functions. In addition, or alternatively, the policy agent 130 may comprise software operating in any of a number of computing devices.

The thermal management system 202 is also depicted as including various components of the data center 100. More particularly, the electronic components 116a-116n and the external sensors 120a-120n are depicted diagrammatically within the data center 100. In addition, each of the electronic components 116a-116n is depicted as including one or more heat generating devices 210 and one or more sensors 212. As described above, the heat generating devices 210 may comprise, for instance, processors, micro-controllers, high-speed video cards, memories, semi-conductor devices, and the like, provided with the electronic components 116a-116n. In addition, the sensors 212 may comprise sensors configured to detect the temperatures of the heat generating devices 210. As such, for instance, the sensors 212 may comprise temperature sensors that are supplied with the heat generating devices 210. In addition, or alternatively, the sensors 212 may comprise temperature sensors that are added to the electronic components 116a-116n during manufacture of the electronic components 116a-116n, including the addition of the heat generating devices 210.

As further described above, the external sensors 120a-120n may comprise sensors configured to detect at least one environmental condition, such as, airflow temperature, mass flow rates of airflow, velocities of airflow, absolute humidity, pressure, etc. Generally speaking, the external sensors 120a-120n may comprise any sensor in the data center 100 other than the sensors 212 associated with the electronic components 116a-116n. In one regard, therefore, the external sensors 120a-120n may comprise sensors configured to detect ambient conditions outside of the electronic components 116a-116n.

Also depicted in the data center 100 are cooling system components 204, which may include the air moving devices 114a-114n and the air delivery devices 118. The cooling system components 204 are also depicted as including actuators 206, which may comprise various different types of actuators. For instance, for the air moving devices 114a-114n, the actuators 206 may comprise devices configured to vary the temperature or the flow rate at which air is supplied by the air moving devices 114a-114n. In addition, for the air delivery devices 118, the actuators 206 may comprise motors designed to vary the direction or the rate at which airflow is supplied through the air delivery devices 118.

In operation, the data center 100 may receive a workload 220, which may be in the form of web requests, data analysis, multimedia rendering, or other types of applications. The workload 220 may be received by a workload manager 214, which may comprise any of the computing devices described above. The workload manager 214 may moreover comprise a microprocessor, a micro-controller, an application specific integrated circuit (ASIC), and the like, configured to perform various processing functions. In addition, or alternatively, the workload manager 214 may comprise software operating in any of a number of computing devices. Moreover, the workload manager 214 may comprise or form part of the controller 130.

In one instance, the workload manager 214 may determine which of the electronic components 116a-116n comprises configurations suitable to perform the workload 220. In another instance, the workload manager 214 may determine which of those electronic components 116a-116n have sufficient capacities to perform the workload 220. In a further instance, the workload manager 214 may determine the number of electronic components 116a-116n required or have been contracted to perform the workload 220. In any case, the workload manager 214 may assign the workload 220 to the selected one or more electronic components 116a-116n. However, prior to assigning the workload 220, the policy agent 130 may communicate instructions to the workload manager 214 to assign the workload 220 according to one or more control policies as described in greater detail herein below.

The workload manager 214 may also monitor various activities of the electronic components 116a-116n. For instance, the workload manager 214 may monitor the levels at which the electronic components 116a-116n are operating, for instance, the power states of the heat generating devices 210 of the electronic components 116a-116n. As another example, the workload manager 214 may track network utilization in the data center 100 as well as the power and temperature statuses of the electronic components 116a-116n. The temperature statuses may be communicated to the workload manager 214 from the sensors 212.

The workload manager 214 may transmit or otherwise send the monitored information to the policy agent 130 over a network 230, which represents a wired or wireless structure in the data center 100 for the transmission of data between the various components of the thermal management system 202. The network 230 may comprise an existing network infrastructure or it may comprise a separate network configuration installed for the purpose of thermal management by the policy agent 130. The network 230 may also form a communication link between the external sensors 120a-120n and the policy agent 130. Alternatively, however, the external sensors 120a-120n may communicate detected condition information to the workload manager 214.

The workload manager 214 may collect the monitored information from the electronic components 116a-116n, and in certain instances, from the external sensors 120a-120n, and may tag the monitored information with identifying data prior to communicating the monitored information to the policy agent 130. The identifying data may include, for instance, information pertaining to the electronic component 116a-116n, the sensor 212, and the external sensor 120a-120n from which the monitored information was received. In addition, the workload manager 214 may tag the monitored information with the identifying data in, for instance, metadata communicated to the policy agent 130.

Although the workload manager 214 has been described as performing various specific functions, it should be understood that the workload manager 214 may perform many other functions with regard to assigning the workload 220 as well as in tracking the electronic components 116a-116n in performing the workload 220, without departing from a scope of the thermal management system 202 disclosed herein.

In any regard, the policy agent 130 may invoke a data collection module 240 to collect and store the monitored information received from the workload manager 214. The monitored information may be stored, for instance, in a database 250 that the policy agent 130 may access. The database 250 may store additional information pertaining to the electronic components 116a-116n, the external sensors 120a-120n, and the cooling system components 204. The additional information may include, for instance, the locations of the electronic components 116a-116n and the external sensors 120a-120n. The additional information may further include the locations and rated capacities of the air moving devices 114a-114n, the locations of the air delivery devices 118, etc. Although the database 250 has been illustrated as forming part of the policy agent 130, the database 250 may comprise a separate component without departing from a scope of the thermal management system 202.

The policy agent 130 may also invoke a data analysis module 242 to analyze the monitored information. More particularly, for instance, the data analysis module 242 may process the monitored information to develop a thermal map of the data center 100, as described in greater detail herein below.

The policy agent 130 may invoke a plan formulation module 244 to, for instance, formulate a control scheme for the cooling system components 204 based upon the thermal map developed by the data analysis module 242. In addition, the policy agent 130 may invoke an implementation module 246 to implement the plan formulated by the policy agent 130. In another example, the policy agent 130 may invoke the plan formation module 244 to formulate a workload distribution scheme for the electronic components 116a-116n based upon the thermal map. In this example, the policy agent 130 may invoke the implementation module 246 to assign the workloads 220 to one or more of the electronic components 116a-116n in order, for instance, to minimize hot spot formation, increase cooling system component 204 efficiencies, etc.

Some or all of the modules 240-246 may comprise software stored either locally or in an external memory which the policy agent 130 may invoke. In addition, or alternatively, some or all of the modules 240-246 may comprise one or more hardware devices that may be implemented by the policy agent 130. As such, for example, the policy agent 130 may be stored at a single location or the policy agent 130 may be stored in a distributed manner across multiple locations, where the location(s) comprise at least one of hardware and software.

Figure 3:
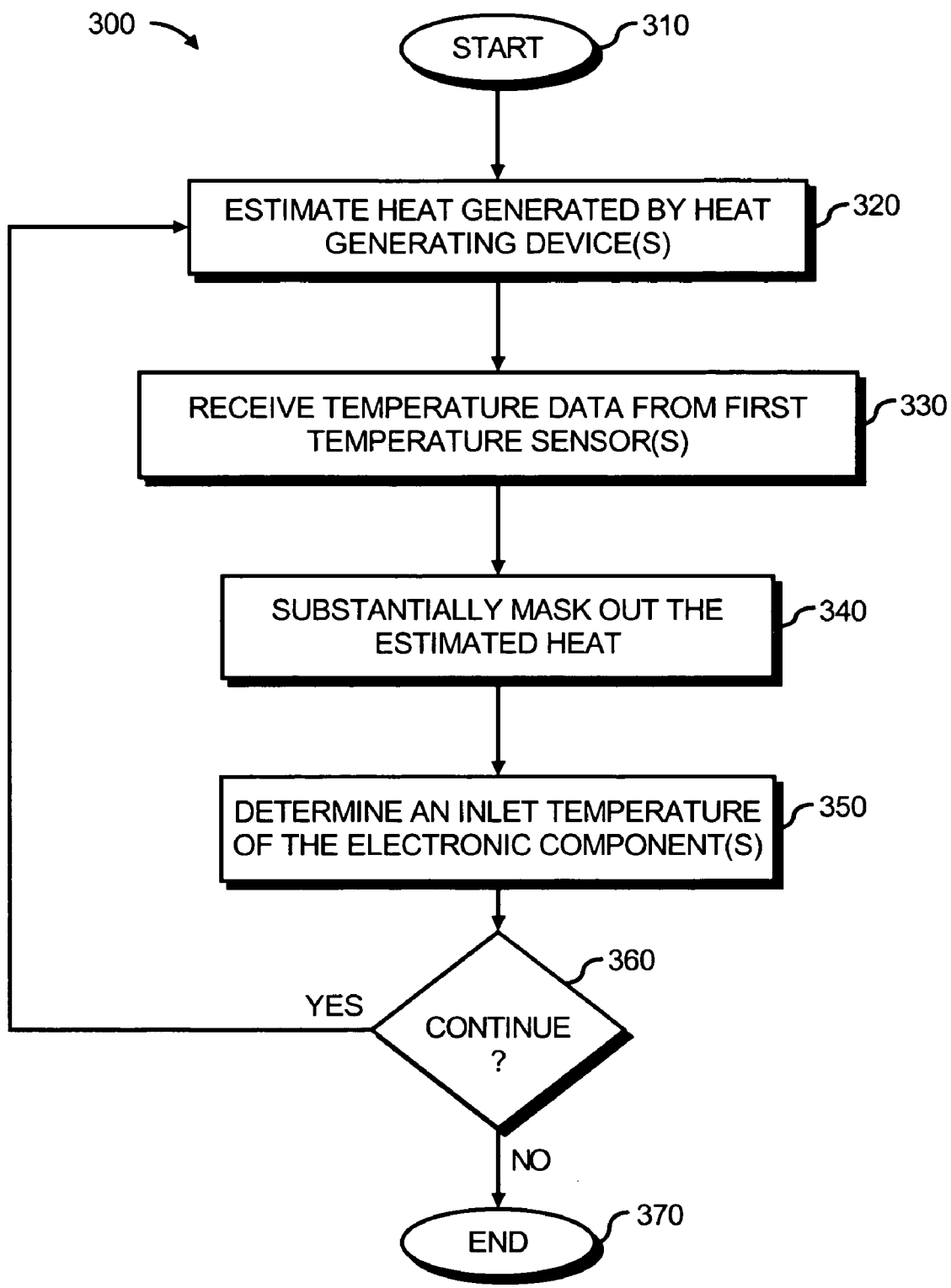
FIG. 3 shows a flow diagram of a method for thermally managing a data center, according to an embodiment of the invention.

Turning now to FIG. 3, there is shown a flow diagram of a method 300 for thermally managing a data center, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the thermal management system 202 illustrated in FIG. 2, and thus makes reference to the elements cited therein. It should, however, be understood that the method 300 is not limited to the elements set forth in the thermal management system 202. Instead, it should be understood that the method 300 may be practiced by a system having a different configuration than that set forth in the thermal management system 202.

Generally speaking, the method 300 may be employed by the policy agent 130 to thermally manage the data center 100. The terms "thermally manage" may be defined, for instance, as the ability of the policy agent 130 to monitor and assess thermal conditions in the data center 100. In addition, these terms may be defined as the ability of the policy agent 130 to formulate and implement cooling or workload placement schemes based upon the assessed thermal conditions.

The method 300 may be initiated at step 310 in response to any of a number of stimuli or conditions. For instance, the method 300 may be initiated with activation of the electronic components 116a-116n. In addition, or alternatively, the method 300 may be manually initiated or the policy agent 130 may be programmed to initiate the method 300 at various times, for a set duration of time, substantially continuously, etc.

The following description of the method 300 is directed to a single electronic component 116a having at least one heat generating device 210 and a first temperature sensor 212 configured to detect the temperature of the at least one heat generating device 210. It should, however, be understood that the method 300 may be applied to any reasonably suitable number of electronic components 116b-116n, each having any reasonably suitable number of heat generating devices 210 and first temperature sensors 212.

Once initiated, the policy agent 130 estimates the amount of heat generated by at least one heat generating device 210 of an electronic component 116a, as indicated at step 320. The policy agent 130 may estimate the heat generation based upon the amount of workload being performed by the at least one heat generating device 210. More particularly, for instance, the policy agent 130 may use the workload on the at least one heat generating device 210 as a proxy for the heat generated by the at least one heat generating device 210. In other words, the level of heat generated by the at least one heat generating device 210 may be correlated to the workload on the at least one heat generating device 210. This correlation may be based upon specifications provided by the at least one heat generating device 210 manufacturer, through testing of the at least one heat generating device 210 at various workloads, etc. In addition, this correlation may be stored, for instance, in the form of a look-up table in the database 250 for relatively easy access and retrieval by the policy agent 130.

The correlation between the workload and the heat generated by the at least one heat generating device 210 may also include other considerations. One of these considerations may include a time function, because the at least one heat generating device 210 may continue generating heat for some time following cessation of the workload performance. The rate at which the at least one heat generating device 210 becomes cooler following cessation of the workload may also be based upon specifications provided by the at least one heat generating device 210 manufacturer, through testing of the at least one heat generating device 210, etc. This information may also be stored in a look-up table in the database 250.

In any regard, at step 320, the policy agent 130 may estimate the heat generated by the at least one heat generating device 210 at a particular time based upon the workload on the at least one heat generating device 210 or the amount of time that has elapsed since the workload was performed. In addition, the policy agent 130 may track the time at which the heat generating component temperature was estimated.

At step 330, the policy agent 130 may receive temperature data from a first sensor 212 of the electronic component 116a. The first sensor 212 may comprise a temperature sensor positioned to detect the temperature of the at least one heat generating device 210. In this regard, and as described above, the first sensor 212 may comprise a temperature sensor supplied or integrally manufactured with the at least one heat generating device 210.

At step 340, the policy agent 130 may substantially mask out the heat generated by the at least one heat generating device 210 from the temperature detected by the first sensor 212. In addition, at step 350, the policy agent 130 may determine an inlet temperature of the electronic component 116a based upon the difference between the substantially masked out temperature and the temperature detected by the first temperature sensor 212. In other words, the policy agent 130 is configured to determine the inlet temperature of the electronic component 116a through calculation of the following equation:

$$T_{inlet} = T_{measured} - T_{workload}.$$ Equation (1)

As shown in Equation (1), the inlet temperature ($T_{inlet}$) is equal to the difference between the temperature measured by the first temperature sensor 212 ($T_{measured}$) and the temperature of the at least one heat generating device 210 ($T_{workload}$), which is estimated based upon the workload on the at least one heat generating device 210.

Equation (1), however, may be refined to account for temperatures detected by multiple sensors in an electronic component 116a. For instance, for an electronic component 116a having X temperature sensors 212, at each sensor i, the measured temperature $M_i$ is the sum of the inlet temperature and the amount of heat present at that location within the electronic component 116a, $H_i$, due to the recent workload on the electronic component 116a. The heat present, $H_i$, and the measured temperature, $M_i$, may be represented in a one-dimensional matrix as:

$$T_{inlet} + [H_0 H_1, \ldots H_X]^T = [M_0 M_1 \ldots M_X]^T.$$ Equation (2)

In order to leverage upon the relationship between system utilization metrics, such as, processor usage, memory access rates, disk read/write throughput, etc., the policy agent 130 may include workload on the electronic component 116a as a proxy for the amount of heat generated by the electronic component 116a as described above with respect to step 320. In this regard, the policy agent 130 may characterize the current workload on the electronic component 116a using Y of the system utilization metrics. The current measured internal temperatures, $M_i$, combined with the current workload characterization parameters, $W_i$, may be represented by D, the complete set of relevant and current instrumentation values that may be used to determine the inlet temperature of the electronic component 116a, as indicated in the following equation.

$$D = \{[W_0 W_1, \ldots W_X]^T, [M_0 M_1 \ldots M_X]^T\}.$$ Equation (3)

The policy agent 130 may also be configured to address the time-dependence aspect of heat flow, for instance, because the heat generating device(s) 210 continues to generate heat when the heat generating device(s) 210 is in an idle state following a period of activity. Therefore, because the current workload on the electronic component 116a is constant (idle), but the internal temperature of the electronic component 116a varies during this period, the policy agent 130 may include recent data in addition to current data to predict the effect the workload has on the internal temperature of the electronic component 116a. As such, the policy agent 130 may calculate the inlet temperature of the electronic component 116a at a time t by including N most recent data sets, as indicated in the following equation.

$$T_{inlet} = f(D_t, D_{t-1}, \ldots, D_{t-N})$$ Equation (4)

At step 360, the policy agent 130 may determine whether the method 300 is to continue. If a "no" condition is reached at step 360, the method 300 may end as indicated at step 370. The policy agent 130 may determine that the method 300 is to end, for instance, following a predetermined length of time, following a predetermined number of iterations, manually discontinued, etc. If a "yes" condition is reached at step 360, the method 300 may continue beginning at step 330. In addition, steps 320-360 may be repeated substantially continuously, until a "no" condition is reached at step 360. Moreover, the policy agent 130 may wait for a period of time prior to again performing step 320.

Figure 4:
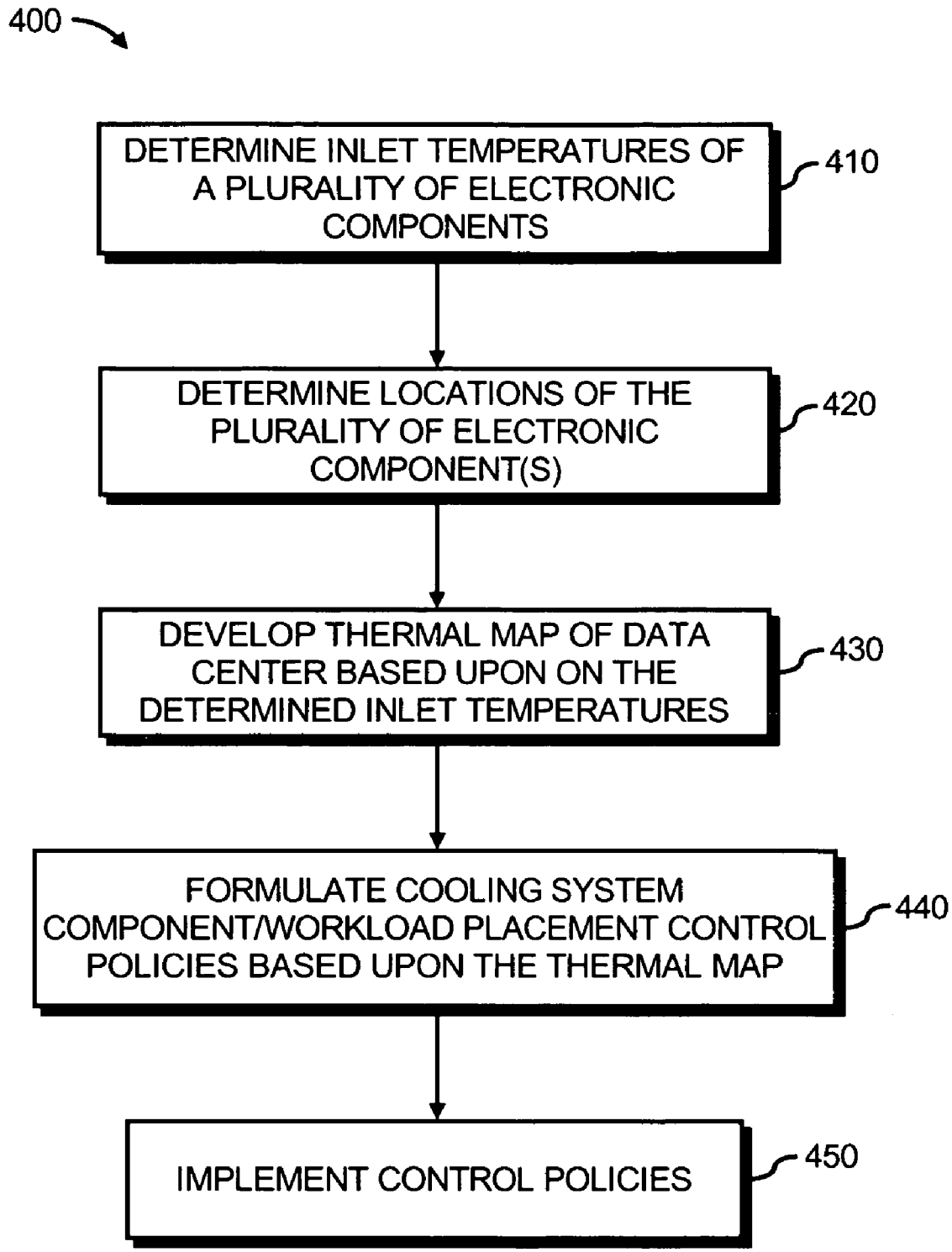
FIG. 4 shows a flow diagram of a method for thermally managing a data center similar to FIG. 3, according to a further embodiment of the invention.

Turning now to FIG. 4, there is shown a method 400 for thermally managing a data center similar to FIG. 3, according to a further example. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

In the method 400, the policy agent 130 may implement the method 300 for a plurality of electronic components 116b-116n and may thus determine the inlet temperatures at a plurality of locations in the data center 100, as indicated at step 410. At step 420, the policy agent 130 may determine the locations of the plurality of electronic components 116a-116n. By way of example, the electronic component 116a-116n locations may be stored in the database 250, which the policy agent 130 may access. The electronic component 116a-116n locations may be stored in a look-up table and the policy agent 130 may cross-reference serial numbers or other identifying data of the electronic components 116a-116n with their stored locations in the look-up table. As such, the policy agent 130 may correlate the determined temperatures at the inlets of the plurality of electronic components 116a-116n with their locations in the data center 100.

In addition, at step 430, the policy agent 130 may develop a thermal map of the data center 100 based upon the determined inlet temperatures and their corresponding locations in the data center 100. The policy agent 130 may further invoke the plan formulation module 244 to develop cooling system component 204/workload placement control policies based upon the thermal map, as indicated at step 440. The control policies may be developed to, for instance, minimize hot spot formation, increase cooling system component 204 efficiencies, reduce total power consumption in the data center 100, etc. In addition, the policy agent 130 may invoke an implementation module 246 to implement the control policies as indicated at step 450.

Figure 5A:
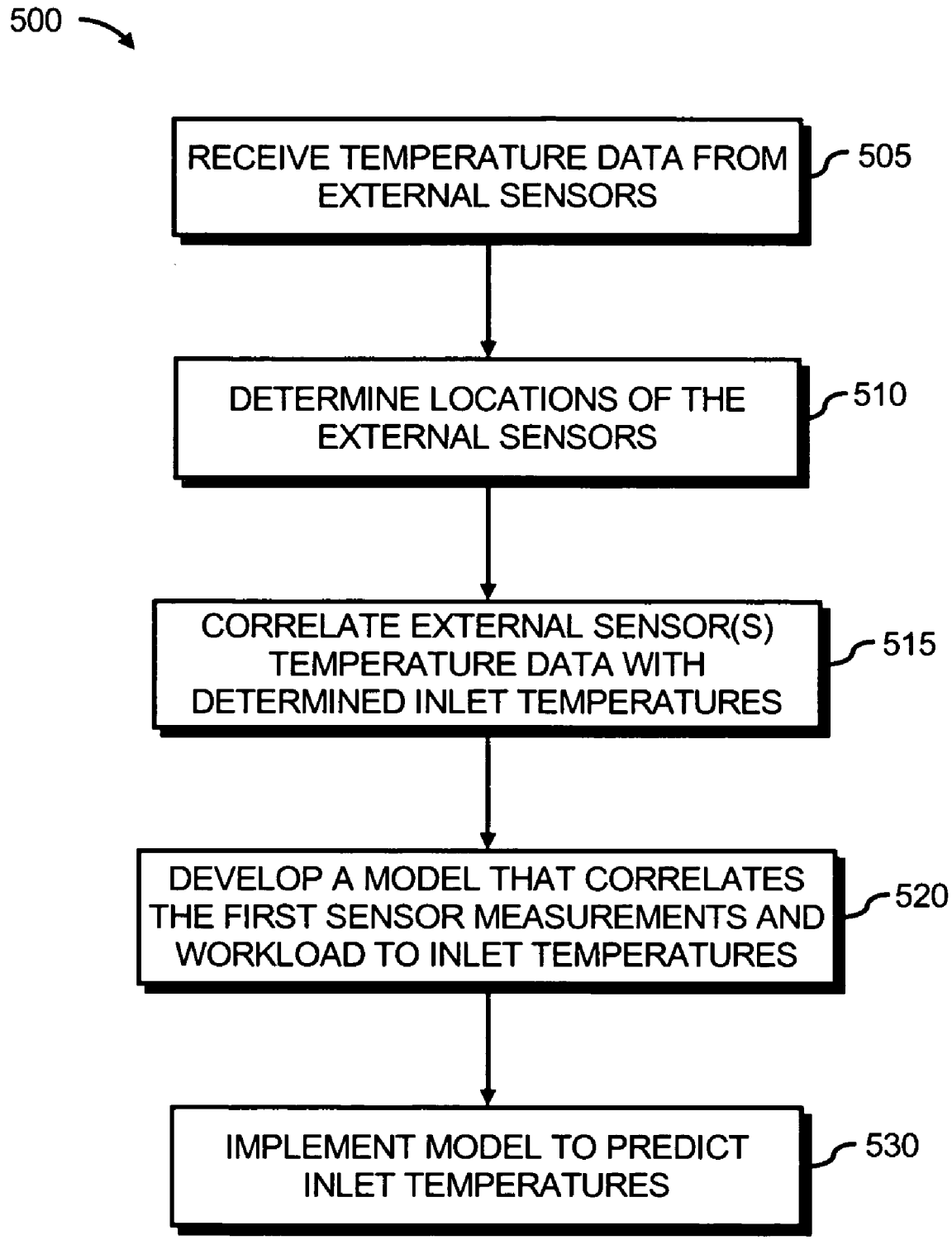
FIG. 5A shows a flow diagram of a method for predicting the inlet temperatures of electronic components, according to a further embodiment of the invention.

With reference now to FIG. 5A, there is shown a method 500 for predicting the inlet temperatures of the electronic components 116a-116n, according to an example. It is to be understood that the following description of the method 500 is but one manner of a variety of different manners in which an example of the invention may be practiced. It should also be apparent to those of ordinary skill in the art that the method 500 represents a generalized illustration and that other steps may be added or existing steps may be removed, modified or rearranged without departing from a scope of the method 500.

Generally speaking, the method 500 pertains to the use of machine learning applications to predict the inlet temperatures for the electronic components 116a-116n. More particularly, the machine learning application may develop the model using historical data pertaining to past correlations between the temperature measurements obtained by the first sensors 212 and the heat load on the electronic components 116a-116n with the temperatures at the inlets of the electronic components 116a-116n. The policy agent 130 may also implement the method 500 to develop different models for different types of electronic components 116a-116n. Thus, for instance, the policy agent 130 may develop a first model for an electronic component 116a having a first configuration, a second model for an electronic component 116b having a second configuration, and so forth. Moreover, the policy agent 130 may implement the models to predict the temperatures at the inlets of the various electronic components 116a-116n that are outside of a training set of data.

At step 505, the policy agent 130 may receive temperature data from the external sensors 120a-120n. At step 510, the policy agent 130 may determine the locations of the external sensors 120a-120n from which the policy agent 130 received the temperature data. By way of example, the external sensor 120a-120n locations may have previously been stored in the database 250. In addition, the external sensor 120a-120n locations may be stored in a look-up table and the policy agent 130 may cross-reference serial numbers or other identifying data of the external sensors 120a-120n with their locations, which have been stored in the look-up table. As such, the policy agent 130 may correlate the temperature data with the locations in the data center 100 at which the temperature data were received.

In one example, the external sensors 120a-120n may be positioned near inlets of a plurality of respective electronic components 116a-116n. As such, the temperature data that the policy agent 130 received at step 505 may comprise temperatures detected at or near the inlets of the respective electronic components 116a-116n. In this example, at step 515, the temperature data received from the external sensors 120a-120n, including the locations at which the temperature data were received, are correlated with the inlet temperatures determined, for instance, at step 410. In other words, an electronic component 116a and an external sensor 120a positioned at or near the inlet of the electronic component 116a are correlated based upon their locations with respect to each other.

In another example, an external sensor 120a-120n may be positioned to detect the inlet temperatures of different types of electronic components 116a-116n. For instance, a first external sensor 120a may be positioned to detect the inlet temperature of a first electronic component 116a, a second external sensor 120b may be positioned to detect the inlet temperature of a second electronic component 116b, etc., wherein the first electronic component 116a differs, for instance, in configuration, from the second electronic component 116b. In this regard, the inlet temperatures for differing types of electronic components 116a-116b may be detected at step 505 and may be correlated to the differing types of electronic components 116a-116n at step 515.

Although multiple external sensors 120a-120n have been described as being positioned to detect the inlet temperatures, it should be understood that a single external sensor 120a may also be employed to detect the plurality of electronic component 116a-116n inlet locations. In this example, the single external sensor 120a may be movable with respect to the electronic components 116a-116n, and its location with respect to the electronic components 116a-116n when the temperature measurements are taken is also tracked.

At step 520, the policy agent 130 may use the inlet temperatures detected by the external sensors 120a-120n to develop models, either online or offline, that correlate the first sensor 212 measurements and workloads on the electronic components 116a-116n to the inlet temperatures. More particularly, for instance, the policy agent 130 may invoke the data analysis module 242 to implement a suitable machine learning application to develop the model. A "suitable" machine learning application is one that is capable of producing an output that falls within a continuous range of values, capable of representing complex relationships, given that the equations governing heat flow and transfer are non-linear, capable of constructing the model using a relatively large amount of input data, and capable of making substantially real-time predictions using the most recent instrumentation data.

Figure 5B:
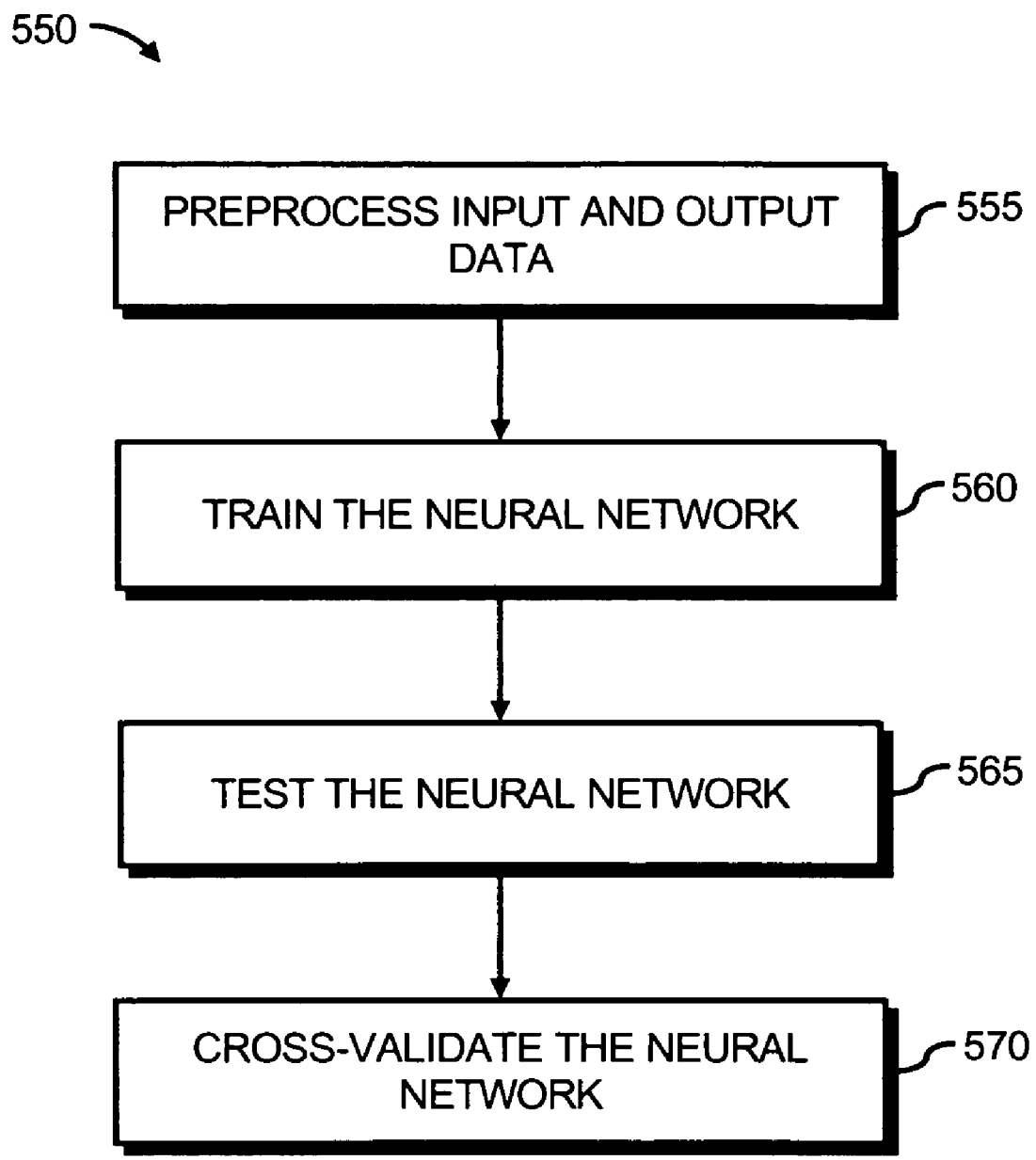
FIG. 5B shows a flow diagram of a method for developing a model used in FIG. 5A, according to an embodiment of the invention.

Examples of suitable machine learning applications are neural networks, Markov models, and linear programming, to name but a few. A more detailed description of an example in which the model is developed using a neural network is presented herein below with respect to the method 550 depicted in FIG. 5B.

More particularly, in the following example, the policy agent 130 may use a neural network to develop a model that the policy agent 130 may implement to predict how heat is generated and flows within the electronic components 116a-116n. In addition, the policy agent 130 may implement the method 550 to develop different models for each of the different types of electronic components 116a-116n.

The policy agent 130 is configured to develop a model having $N \cdot (X+Y)$ inputs, where N represents the most recent epochs, X is the number of first sensors 212, and Y is the number metrics used to characterize current electronic component 116a workload. The output of the model is the predicted ambient air temperature, which the policy agent 130 may use to deduce the amount of heat added by the heat generating devices 210 contained in the electronic component 116a. The policy agent 130 may graphically position the inputs in an input layer and the outputs in an output layer. Between the input layer and the output layer, there are L internal or hidden layers. Each layer contains a set of elements known as neurons, where each neuron i accepts $N_i$ inputs from the previous layer, applies a weighting factor $\omega_{i,a}$ to each input $\chi_a$, and uses the sum of the weighted inputs as the x-value for its activation function g. The result of this function, $y_i$ is passed to neurons in the next layer.

$$y_i = g\left(\sum_{a=0}^{N_i} \omega_{i,a} \cdot \chi_a\right).$$

Equation (5)

The policy agent 130 may employ the sigmoid activation function because it only allows positive output values from neurons and outputs contiguous values. An example of the sigmoid activation function is:

$$gx = \frac{1}{1 + e^{-(x \cdot s)}}. \qquad \text{Equation (6)}$$

In Equation (6), the sigmoid parameter s controls the steepness of the output slope.

As shown in the method 550, the policy agent 130 may preprocess the input and output data sets at step 555. The output values will be in the range [0,1], due to the sigmoid function. As such, the policy agent 130 may scale all of the input and output values to fall within the range [0,1] to thereby provide consistency between input and output data and to allow the model to predict a relatively wide range of electronic component 116a-116n inlet temperatures.

At step 560, the policy agent 130 may train the neural network. More particularly, for instance, the policy agent 130 may select a set of values for the model and implementation parameters, and may construct the neural network by calculating the weights for each input to each neuron. In other words, at step 560, the policy agent 130 may provide a set of inputs and outputs, and may adjust the weights to minimize the mean square error (MSE) between the predicted outputs and the actual outputs over the entire set of training data. In essence, therefore, the policy agent 130 may to train the neural network through solving an optimization problem that minimizes the MSE. The policy agent 130 may leverage various techniques to solve the optimization problem, such as, genetic algorithms, simulated annealing, back-propagation, etc.

The policy agent 130 may continue performing step 560 in an iterative manner until the MSE reaches a user-defined minimum threshold or the policy agent 130 determines that step 560 has been performed a pre-specified number of times.

Once the policy agent 130 has completed training the neural network at step 560, the policy agent 130 may test the neural network, as indicated at step 565. More particularly, for instance, the policy agent 130 may use the neural network to predict the outputs for a given set of inputs that were not present in the training data. As such, the testing step 565 enables the policy agent 130 to examine to what extent the neural network is generally applicable, and that the training step 560 did not create a neural network that is overly-trained to inputs it has already encountered.

At step 570, the policy agent 130 may cross-validate the neural network. For example, the policy agent 130 may employ a five-fold cross-validation (FFCV), which is a standard statistical analysis technique, to generally assess the suitability of the manner in which the neural network was developed. In implementing the FFCV technique, the policy agent 130 may divide the input, output tuples into fifths. The policy agent 130 uses one fifth as a test set and the learner is trained on the other four fifths. This policy agent 130 repeats this process five times with a different fifth used for testing each time.

By way of example, if there is data from ten electronic components, the electronic components are broken into five groups of two servers each. The first neural net is trained using data from the first eight electronic components, and tested on the ninth and tenth electronic components. The second neural network is trained using data from electronic components 1-6, and electronic components 9 and 10; and this neural network is tested using data from electronic components 7 and 8.

The policy agent 130 may quantify the suitability of a given set of model and implementation parameters by calculating the sum of squared error (SSE) across the five neural networks generated during FFCV. A relatively smaller SSE generally indicates that the model and implementation parameters generate suitably accurate models.

With reference back to FIG. 5A, the policy agent 130 may implement the model developed, for instance, as described with respect to the method 500 (FIG. 5B), to predict the temperatures at the inlets of the electronic components 116a-116n. As such, the policy agent 130 may predict the inlet temperature for an electronic component 116a for a detected workload and interior temperature, without having to rely on an exterior temperature sensor 120a-120n.

The operations set forth in the methods 300, 400, 500, and 550 may be contained as a utility, program, or subprogram, in any desired computer accessible medium. In addition, the method 300, 400, 500, and 550 may be embodied by a computer program, which may exist in a variety of forms both active and inactive. For example, it can exist as software program(s) comprised of program instructions in source code, object code, executable code or other formats. Any of the above can be embodied on a computer readable medium, which include storage devices.

Exemplary computer readable storage devices include conventional computer system RAM, ROM, EPROM, EEPROM, and magnetic or optical disks or tapes. It is therefore to be understood that any electronic device capable of executing the above-described functions may perform those functions enumerated above.

Figure 6:
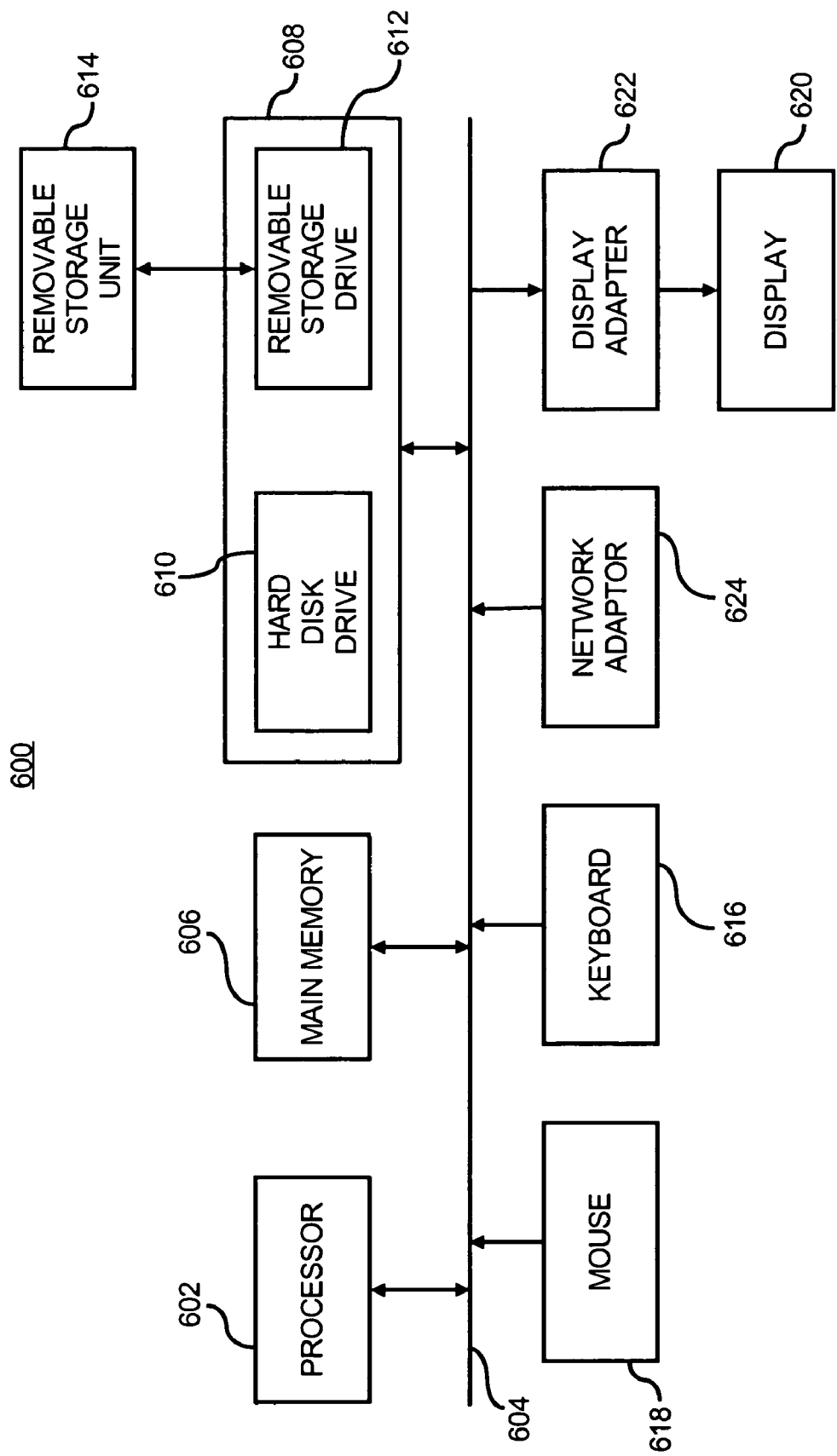
FIG. 6 illustrates a computer system, which may be employed to perform various functions described herein, according to an embodiment of the invention.

FIG. 6 illustrates a computer system 600, which may be employed to perform the various functions of policy agent 130 described herein above, according to an example. In this respect, the computer system 600 may be used as a platform for executing one or more of the functions described hereinabove with respect to the policy agent 130.

The computer system 600 includes a processor 602, which may be used to execute some or all of the steps described in the methods 300, 400, 500, and 550. Commands and data from the processor 602 are communicated over a communication bus 604. The computer system 600 also includes a main memory 606, such as a random access memory (RAM), where the program code for, for instance, the policy agent 130, may be executed during runtime, and a secondary memory 608. The secondary memory 608 includes, for example, one or more hard disk drives 610 and/or a removable storage drive 612, representing a floppy diskette drive, a magnetic tape drive, a compact disk drive, etc., where a copy of the program code for thermally managing a data center may be stored.

The removable storage drive 610 reads from and/or writes to a removable storage unit 614 in a well-known manner. User input and output devices may include a keyboard 616, a mouse 618, and a display 620. A display adaptor 622 may interface with the communication bus 604 and the display 620 and may receive display data from the processor 602 and convert the display data into display commands for the display 620. In addition, the processor 602 may communicate over a network, for instance, the Internet, LAN, etc., through a network adaptor 624.

It will be apparent to one of ordinary skill in the art that other known electronic components may be added or substituted in the computer system 600. In addition, the computer system 600 may include a system board or blade used in a rack in a data center, a conventional "white box" server or computing device, etc. Also, one or more of the components in FIG. 6 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for thermally managing a data center housing at least one electronic component, said method comprising steps performed by a processor, said method comprising:
   in the processor,
   (a) estimating heat generated by a heat generating device of the at least one electronic component;
   (b) receiving a temperature detected by a first temperature sensor positioned to detect an interior temperature of the at least one electronic component;
   (c) substantially masking out the estimated heat generated by the at least one heat generating device from the temperature detected by the first temperature sensor; and
   (d) determining an inlet temperature of the at least one electronic component from a difference between the substantially masked out temperature and the temperature detected by the first temperature sensor.

2. The method according to claim 1, wherein estimating the heat generated by the at least one heat generating device farther comprises:
   in the processor,
   (e) tracking a workload performed by the at least one heat generating device; and
   (f) correlating the workload to a heat generation amount of the at least one heat generating device to thereby estimate the heat generated by the heat generating device.

3. The method according to claim 1, further comprising:
   in the processor,
   (e) receiving a temperature detected by a second temperature sensor positioned externally to an inlet of the electronic component; and
   (f) creating at least one of an online and an offline model configured to predict the inlet temperature from the temperature detected by the second temperature sensor, the temperature detected by the first temperature sensor, and a correlated heat generation amount.

4. The method according to claim 3, wherein step (f) further includes creating the model to compensate for an amount of time that has elapsed since the at least one electronic component performed a workload to compensate for continued heat generated by the heat generating device when the at least one electronic component enters into an idle state from an active state.

5. The method according to claim 3, wherein step (f) further comprises creating the model through implementation of a machine learning application.

6. The method according to claim 5, further comprising:
   in the processor,
   (g) implementing the machine learning application to construct a neural network that correlates temperatures detected by the second temperature sensor, temperatures detected by the first temperature sensor, and the correlated heat generation amounts.

7. The method according to claim 6, wherein step (g) further comprises:
   training the neural network with a training set of data to construct the model;
   testing an accuracy of the model; and
   wherein step (d) further comprises predicting an inlet temperature from the model based upon an estimated heat generation amount and temperature detected by the first temperature sensor that are outside of the training set of data.

8. The method according to claim 1, wherein the data center houses a plurality of differently configured electronic components, said method further comprising:
   in the processor,
   (e) receiving temperatures detected by a plurality of second temperature sensors positioned externally to inlets of the plurality of electronic component; and
   (f) creating a plurality of different models, wherein each of the plurality of different models is configured to predict the inlet temperatures from the temperatures detected by the plurality of second temperature sensors, the temperatures detected by the first temperature sensors, and correlated heat generation amounts, for each of the differently configured electronic components.

9. The method according to claim 1, wherein the at least one electronic component comprises a plurality of heat generating devices and a plurality of first temperature sensors, and wherein step (a) comprises estimating heat generated by the plurality of heat generating devices, step (b) comprises receiving temperatures detected by the plurality of first temperature sensors, step (c) comprises substantially masking out the estimated heat generated by the plurality of heat generating devices, and step (d) comprises determining the inlet temperature based upon the substantially masked out temperatures detected by the plurality of first temperature sensors.

10. The method according to claim 1, wherein the data center houses a plurality of electronic components, said method further comprising:
    in the processor
    (e) repeating steps (a)-(d) for the plurality of electronic components to determine inlet temperatures of the plurality of electronic components; and
    (f) developing a thermal map of the data center from the inlet temperatures.

11. The method according to claim 10, further comprising:
    utilizing the thermal map to develop one or both of a cooling system control and a workload placement policy; and
    implementing the developed one or both of the cooling system control and workload placement policy in the data center.

12. A system for thermally managing a data center housing a plurality of electronic components, each of said plurality of electronic components having at least one heat generating device, said system comprising:
    a plurality of first temperature sensors positioned to detect interior temperatures of the plurality of electronic components,
    a data collection module for collecting data pertaining to workloads on the plurality of electronic components and temperatures detected by the plurality of first temperature sensors;
    a data analysis module for analyzing the data collected by the data collection module, said data analysis module being configured to substantially mask out the estimated heat generated by the heat generating devices from the temperatures detected by the plurality of first temperature sensors; and
    a controller configured to invoke the data analysis module to determine inlet temperatures of the plurality of electronic components from differences between the substantially masked out temperatures and the temperatures detected by the plurality of first temperature sensors.

13. The system according to claim 12, wherein the controller is further configured to track workloads performed by the plurality of electronic components and to correlate the workloads with amounts of heat generated by the plurality of electronic components.

14. The system according to claim 13, wherein the controller is further configured to develop at least one model designed to predict the inlet temperatures of the plurality of electronic components, wherein the model is created using a training set of data, said training set of data being composed of temperatures detected by the plurality of first temperature sensors, temperatures detected by second temperature sensors positioned externally to less than all of the plurality of electronic components, and the correlated amounts of heat generated by the plurality of electronic components.

15. The system according to claim 14, wherein the controller is further configured to implement a machine learning application to develop the model, and wherein the controller is further configured to implement the model to predict the inlet temperatures of a number of the plurality of electronic components for which inlet temperatures are not directly detected by the second temperature sensors, and wherein the controller is further configured to develop a thermal map of the data center based upon the predicted inlet temperatures.

16. The system according to claim 15, wherein the controller is further configured to develop the model to compensate for an amount of time that has elapsed since each of the plurality of electronic components performed their respective workloads, to thereby compensate for continued heat generation by the heat generating devices when the plurality of electronic components enter into idle states from active states.

17. The system according to claim 15, wherein the machine learning application comprises one of a neural network, a Markov model, and linear programming.

18. The system according to claim 14, wherein the plurality of electronic components comprise differently configured electronic components from each other, and wherein the controller is further configured to develop a plurality of different models, wherein each of the plurality of different models is configured to predict the inlet temperatures from the temperatures detected by the plurality of second temperature sensors, the temperatures detected by the plurality of first temperature sensors, and the correlated heat generation amounts, for each of the differently configured electronic components.

19. The system according to claim 12, wherein the plurality of first temperature sensors are integrated into respective ones of the plurality of electronic components.

20. A computer readable storage medium on which is embedded one or more computer programs, said one or more computer programs implementing a method for thermally managing a data center housing a plurality of electronic components, said one or more computer programs comprising a set of instructions for:

estimating heat generated by a heat generating device of at least one electronic component;

receiving a temperature detected by a first temperature sensor positioned to detect an interior temperature of the at least one electronic component;

receiving a temperature detected by a second temperature sensor positioned to detect an inlet temperature of the at least electronic component;

composing a training set of data including the estimated heat generated, the interior temperature detected by the first temperature sensor, and the inlet temperature detected by the second temperature sensor;

creating a model using the training set of data, wherein the model is configured to predict the inlet temperatures of the plurality of electronic components; and implementing the model to predict an inlet temperature of at least one electronic component for which the inlet temperature is not inlet temperatures are not directly detected by a second temperature sensor.

* * * * *

UNITED STATES PATENT AND TRADEMARK OFFICE
CERTIFICATE OF CORRECTION

| | | |
|---|---|---|
| PATENT NO. | : 7,620,613 B1 | Page 1 of 1 |
| APPLICATION NO. | : 11/494942 | |
| DATED | : November 17, 2009 | |
| INVENTOR(S) | : Justin Moore et al. | |

It is certified that error appears in the above-identified patent and that said Letters Patent is hereby corrected as shown below:

In column 15, line 29, in Claim 2, delete "farther" and insert -- further --, therefor.

In column 16, line 35, in Claim 10, after "processor" insert -- , --.

In column 18, line 25, in Claim 20, after "least" insert -- one --.

Signed and Sealed this

Sixteenth Day of March, 2010

David J. Kappos
*Director of the United States Patent and Trademark Office*